(12) United States Patent
Goodale et al.

(10) Patent No.: US 11,692,816 B2
(45) Date of Patent: Jul. 4, 2023

(54) MOUNTING ARRANGEMENT FOR OPTICAL SYSTEMS

(71) Applicant: Cognex Corporation, Natick, MA (US)

(72) Inventors: Andrew Goodale, Boston, MA (US); Kostas Zafiriou, Somerville, MA (US); Jens Petersen, Jena (DE)

(73) Assignee: COGNEX CORPORATION, Natick, MA (US)

( * ) Notice: Subject to any disclaimer, the term of this patent is extended or adjusted under 35 U.S.C. 154(b) by 917 days.

(21) Appl. No.: 16/397,769

(22) Filed: Apr. 29, 2019

(65) Prior Publication Data

US 2020/0056883 A1 Feb. 20, 2020

Related U.S. Application Data

(60) Provisional application No. 62/663,398, filed on Apr. 27, 2018.

(51) Int. Cl.
*G01B 11/25* (2006.01)
*G02B 7/02* (2021.01)
*G03F 7/00* (2006.01)
*H04N 13/204* (2018.01)
*G01B 5/00* (2006.01)
*G02B 6/02* (2006.01)
*G02B 7/00* (2021.01)
*G02B 7/32* (2021.01)

(52) U.S. Cl.
CPC ........ *G01B 11/2527* (2013.01); *G01B 5/0004* (2013.01); *G02B 7/023* (2013.01); *G03F 7/70883* (2013.01); *H04N 13/204* (2018.05); *G02B 6/02257* (2013.01); *G02B 7/003* (2013.01); *G02B 7/32* (2013.01); *G03F 7/70825* (2013.01)

(58) Field of Classification Search
CPC .. G01B 11/2527; G01B 5/0004; G01B 11/25; G02B 7/023; G02B 6/02257; G02B 7/003; G02B 7/32; G03F 7/70883; G03F 7/70825; H04N 13/204
See application file for complete search history.

(56) References Cited

U.S. PATENT DOCUMENTS

| | | |
|---|---|---|
| 4,997,158 A | 3/1991 | James |
| 6,050,832 A | 4/2000 | Lee et al. |
| 6,056,405 A | 5/2000 | Heintz et al. |
| 6,239,924 B1 | 5/2001 | Watson et al. |
| 6,392,688 B1 | 5/2002 | Barman et al. |

(Continued)

FOREIGN PATENT DOCUMENTS

| | | |
|---|---|---|
| DE | 102012002161 A1 | 8/2013 |
| WO | 2016149412 A1 | 9/2016 |

OTHER PUBLICATIONS

Ju, et al., ACIGA's High Optical Power Test Facility, Class. Quantum Grav., 2004, 21:S887-S893.

(Continued)

*Primary Examiner* — James C. Jones
(74) *Attorney, Agent, or Firm* — Quarles & Brady LLP

(57) ABSTRACT

An optical system can include an optical arrangement supported by an optical chassis. A flexure arrangement can support the optical chassis relative to a separate structure to maintain a calibrated distance between optical components of the optical arrangement.

22 Claims, 11 Drawing Sheets

(56) References Cited

U.S. PATENT DOCUMENTS

| | | | |
|---|---|---|---|
| 6,400,516 B1 | 6/2002 | Spinali | |
| 6,650,412 B1 | 11/2003 | Slater | |
| 6,873,478 B2 | 3/2005 | Watson | |
| 6,922,293 B2 | 7/2005 | Watson et al. | |
| 7,154,684 B2 | 12/2006 | Shibazaki | |
| 7,800,852 B2 | 9/2010 | Blanding et al. | |
| 9,539,762 B2 | 1/2017 | Durand et al. | |
| 2013/0076919 A1* | 3/2013 | Gutierrez | H04N 5/23251 |
| | | | 359/554 |
| 2014/0084527 A1 | 3/2014 | Johnson et al. | |

OTHER PUBLICATIONS

Bal-tec (TM) Home Flexures, http://www.precisionballs.com/Flexures.php, 26 pages.
Bal-tec (TM) Home Flexural Encyclopedia, http://www.precisionballs.com/Flexural_Encyclopedia.php, 30 pages.
Leuze Electronic, LPS 36 HI—Light Section Sensor for Object Measurement, Product Information, 2014, http://www.leuze.com, 8 pages.
Next Intent, Vibration Isolation Flexures, Sep. 7, 2010, http://www.nextintent.com/features/275, 3 pages.

* cited by examiner

MOUNTING ARRANGEMENT FOR OPTICAL SYSTEMS

CROSS-REFERENCE TO RELATED APPLICATIONS

The present application relates to and claims priority from U.S. Provisional Patent Application Ser. No. 62/663,398 filed Apr. 27, 2018, the entire disclosure of which is incorporated herein by reference.

STATEMENT REGARDING FEDERALLY SPONSORED RESEARCH OR DEVELOPMENT

Not applicable.

BACKGROUND OF THE TECHNOLOGY

The present technology relates to arrangements for securing optical systems relative to other components or systems, including the securing of high-precision optical arrangements or other optical subsystems relative to larger optical systems.

In many contexts, it may be useful to align optical or other equipment with a relatively high degree of precision. For example, in order to achieve appropriate and reliable accuracy the context of three-dimensional ("3-D") sensing, as can be useful for measuring dimensions or shapes of objects, it may be important to align a set of imaging devices with a relatively high degree of precision relative to each other or relative to other components of relevant systems.

In many implementations, optical systems can be assembled during manufacture with appropriate precision and can be calibrated accordingly. However, once installed for actual operation, the optical systems can be subject to environmental conditions that can detrimentally affect the precision of the alignment and, accordingly, the validity of the associated calibration. For example, an optical system for 3-D sensing can be used in factories or other settings in which it may be subjected to a variety of forces. These forces, which can result from physical contact, vibrations, spatial or temporal thermal gradients, or other factors, can cause small and large changes to mounting orientation, mounting-surface planarity, and other aspects of relevant components, which can detrimentally affect operation of the optical system as a whole. For example, where environmental forces applied to an optical system cause different sensors of the optical system to move out of their calibrated alignment, the accuracy of subsequent measurements by the optical systems can be degraded. In some cases, even slight changes in alignment of optical components can result in relatively significant degradation of system performance.

BRIEF SUMMARY OF THE TECHNOLOGY

Some embodiments of the technology include an optical system configured to be mounted to a structure for operation. A base can be configured to support the imaging system relative to the structure. An optical arrangement can include optical components that are configured to interoperate and are spatially separated by a calibrated distance. An optical chassis can be configured to support the optical arrangement relative to the base structure. A flexure arrangement, separate from the optical chassis, can connect the optical chassis to the base to maintain the calibrated distance of the optical components.

Some embodiments of the technology include an optical system for assembly in a first location and for installation in a second location d based on a calibrated distance between interoperable optical components. A housing can surround the optical arrangement, to protect the optical arrangement when the housing is mounted in the second location. A flexure arrangement can connect the optical arrangement to the housing, to support the optical arrangement relative to the housing.

Some embodiments of the technology include an optical system that can include an optical arrangement with a first optical component and a second optical component, and a housing with a base. An optical chassis can include a support beam, with the first optical component being mounted at a first end of the support beam, with the second optical component being mounted at a second end of the support beam, and with the first and second optical components being spatially separated by a calibrated distance to operate cooperatively. A flexure arrangement can include a plurality of substantially planar flexures secured to the housing and to the optical chassis to maintain the calibrated distance between the first and second optical components.

DETAILED DESCRIPTION OF THE TECHNOLOGY

Figure 1:
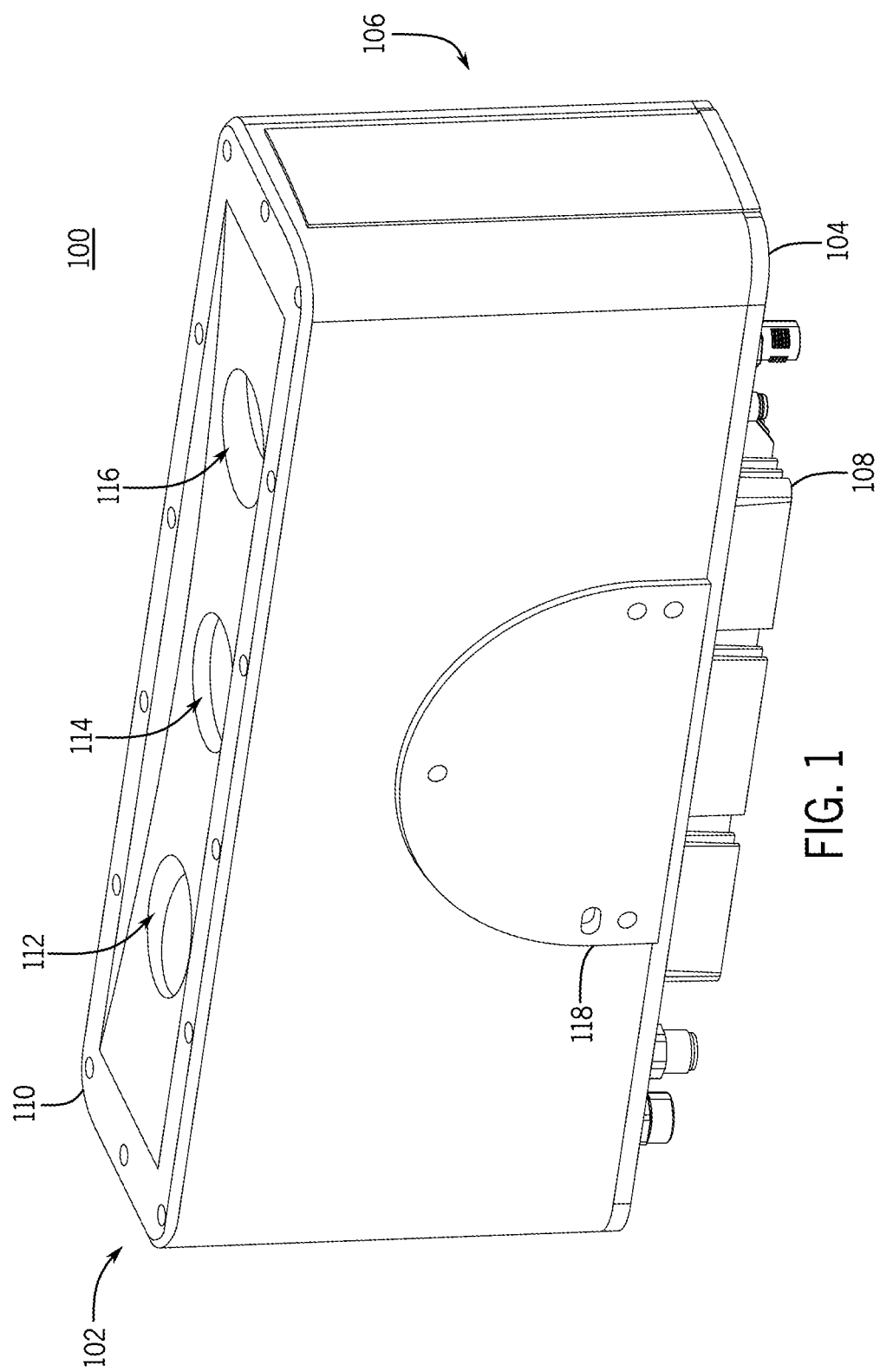
FIG. 1 is an isometric view of a 3-D measurement system with a housing, according to an embodiment of the technology.

In the following detailed description, reference is made to the accompanying drawings that form a part hereof. In the drawings, similar symbols typically identify similar components, unless context dictates otherwise. The example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

As also noted above, to operate certain optical systems reliably, components of the optical systems may need to be installed with relatively precise alignment. For example, some measurement systems may require alignment of optical components (e.g., imaging devices) at a sub-pixel level, as measured on a projected pattern or other target to be imaged, in order to operate with reliable precision.

Known manufacturing techniques can reliably produce optical systems with appropriately precise alignment, and the systems can be calibrated for operation accordingly. However, in operational environments, the optical systems may be subject to forces that can detrimentally affect this alignment. Further, for systems that require relatively high degrees of precision in alignment, even relatively slight deviations from desired alignment, including deviations on the order of microns, can result in substantial degradation in system performance.

As one example, an optical system including a laser line generator and Scheimpflug camera arrangement may be configured to obtain 3-dimensional ("3-D") data from moving parts. In order to install the optical system for operation, the laser and camera equipment may be supported on an optical chassis, such as a rigid beam or similar structure, which may in turn be mounted within a housing. During manufacturing, the optical system, as secured in the housing, can be precisely aligned and then calibrated accordingly. However, when the housing is secured to structures in an operational environment, environmental factors can result in transmission of forces from the housing to the optical chassis, which may tend to detrimentally affect the noted alignment. This may result in corresponding degradation of system performance, including with regard to the accuracy of the 3-D measurements.

Accordingly, with respect to this and many other systems, it may be useful to partially decouple or otherwise isolate an optical chassis from stresses that may be applied to a protective housing or other mounting structure. In this way, for example, forces on the housing or other structure may not necessarily degrade the performance of the associated optical arrangement.

Conventional attempts to address these issues can include instructing users of relevant optical systems to design operational environments and external mounting structures to limit the stresses to which the systems are subjected. This may be difficult in certain contexts, however, or may limit the environments in which certain optical systems can be usefully deployed.

Another conventional approach is to create housings or other mounting structures with relatively high degrees of structural stiffness, so that environmental forces may result in relatively minimal deformation. This approach may also be deficient in some implementations, including because it may be difficult to balance the necessary stiffness for a particular context with corresponding requirements for system size, weight, and cost. Further, in some cases, it may simply not be possible to feasibly implement an appropriately stiff construction so as to avoid even the slight deformations that can detrimentally affect system performance.

Still another conventional approach uses flexible material, such as rubber pads, to attempt to dampen the effects on an optical arrangement of any vibrations or deformations on a housing or support structure. This approach can be useful, but also may not be sufficiently dampening or otherwise appropriate for certain contexts. Further, it can sometimes introduce complications relating to the inherent instability of the flexible connection between the optical arrangement and the relevant support structure(s).

Embodiments of the technology can address the issues noted above, and others, in a variety of ways. In general, some embodiments of the technology can provide a kinematic (or quasi-kinematic) connection between two support structures, a first of which directly supports an optical arrangement, and a second of which is used to support the first relative to an operational environment. With appropriate configuration, this approach can help to limit distortion of the first support structure due to stresses on the second support structure.

In this regard, for example, some embodiments of the technology can include an optical chassis that is configured to directly support a precision, factory-calibrated optical arrangement (e.g., spatially separated imaging devices). Further, a flexure arrangement can be configured to couple the optical chassis to a support base or a housing component for the optical arrangement, with the support base or housing component being directly mounted to an environmental support structure for operation. As further detailed below, this arrangement can help to ensure that stresses on the support base or the housing component are not substantially transferred to the optical chassis and that these stresses accordingly have minimal effect on calibrated aspects (e.g., separation distances) of the optical arrangement on the optical chassis.

Generally, a flexure arrangement can include a plurality of flexures, which can individually substantially restrict movement relative to certain respective degrees of freedom, while individually providing relatively little resistance relative to certain other respective degrees of freedoms. Further, with appropriate configuration, the flexures can collectively provide a relatively rigid overall mounting arrangement. Accordingly, for example, flexures of a flexure arrangement can be secured to extend between an optical chassis and another support structure. With appropriate configuration, as alluded to above, each flexure can substantially restrict movement of the optical chassis relative to certain respective degrees of freedom but can allow relatively free movement of the optical chassis in respective other ways, while the collective flexure arrangement provides a substantially stiff support for the optical chassis without significantly overconstraint. In this regard, for example, a flexure arrangement can collectively support an optical chassis arrangement with appropriate stiffness, while each individual flexure can absorb localized forces to help prevent deformation of the optical chassis and the associated potential for misalignment of the optical arrangement.

In some embodiments, a flexure arrangement can include a plurality of substantially planar sheet-metal flexures (e.g., parallel within typical manufacturing tolerances). This may be useful, for example, in order to provide a relatively inexpensive and easily installed and adjusted system. In some embodiments, a flexure arrangement can include a plurality of substantially planar flexures (e.g., planar to within typical manufacturing tolerances) with reduced-width necks, as may help to accommodate torsional stresses. In other embodiments, however, a variety of other configurations are possible.

Embodiments of the technology can be useful in a variety of different contexts, in order to support a variety of different optical arrangements. In some embodiments, an optical chassis supported by a flexure arrangement can directly support a first optical arrangement, which may require a relatively high degree of precision in relative alignment.

Further, another structure, separate from the optical chassis, can directly support a second optical arrangement, which may not require the same highly precise alignment. This may be particularly useful, for example, in relatively complex 3-D systems, aspects of which are described in German Patent Publication DE 102012002161 A1 and U.S. Pat. No. 6,392,688, both of which are incorporated herein by reference.

FIG. 1 illustrates an example optical system 100 according to one embodiment of the technology. In the embodiment illustrated, the optical system 100 is configured as a 3-D measurement system, to be installed in a factory setting. As also discussed below, such a 3-D measurement system can include a plurality of imaging or other optical devices that are separated from each other by a precise distance and are configured to separately image a projected pattern of light or other imaging target. In other embodiments, other configurations and installation settings are possible.

As illustrated in FIG. 1, the optical system 100 includes a housing 102, with a base support 104 and with a cover configured as a shell 106 that can be secured to the base support 104. The base support 104 includes various mounting features, as may be useful to secure the housing 102 to environmental structures, as well as a heat sink 108 that can be used to disperse heat generated by operation of equipment within the housing 102. In combination with the base support 104, the shell 106 generally surrounds components within the housing 102 and, in some configurations, can provide a liquid-tight seal to protect those components from environmental moisture and other contaminants. A removable top portion 110 of the shell 106 includes a set of optical openings 112, 114, 116, which can be closed and sealed by a corresponding set of windows or lenses. An example mounting feature, configured as a flattened mounting plate 118, is secured to the shell 106 and can also be used to secure the optical system 100 to external support structures (not shown).

The configuration of optical system 100 as illustrated, including the housing 102 generally, the base support 104, and the shell 106, is presented as an example only. In other embodiments, other configurations are possible.

In different contexts, the optical system 100 can be installed in a variety of different orientations, including the orientation shown in FIG. 1 and others. In this regard, unless otherwise defined or limited, any reference to directions herein for the optical system 100, including references such as "above," "below," "left," "right," and so on, are provided relative to the orientations actually shown in the relevant figure(s), rather than in an absolute sense. For example, while the base support 104 can provide a lower base of the optical system 100 relative to gravity (e.g., as oriented in FIG. 1), it can also serve as a side, top, or other structure for the optical system 100 in other installations.

Figure 2:
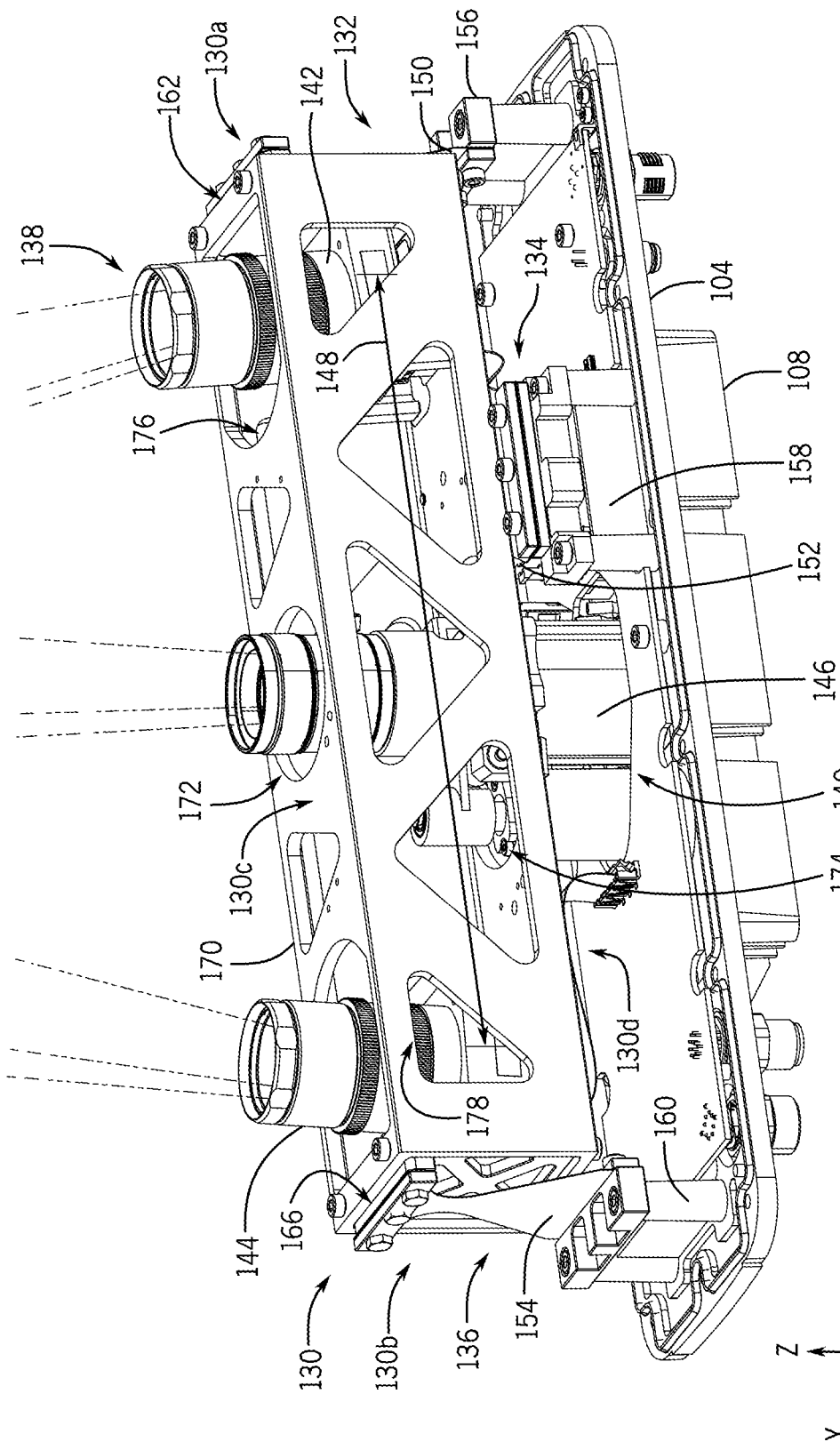
FIGS. 2 and 3 are isometric views of certain internal components of the 3-D measurement system of FIG. 1, including a base of the housing and an optical support system, according to an embodiment of the technology.
Figure 3:
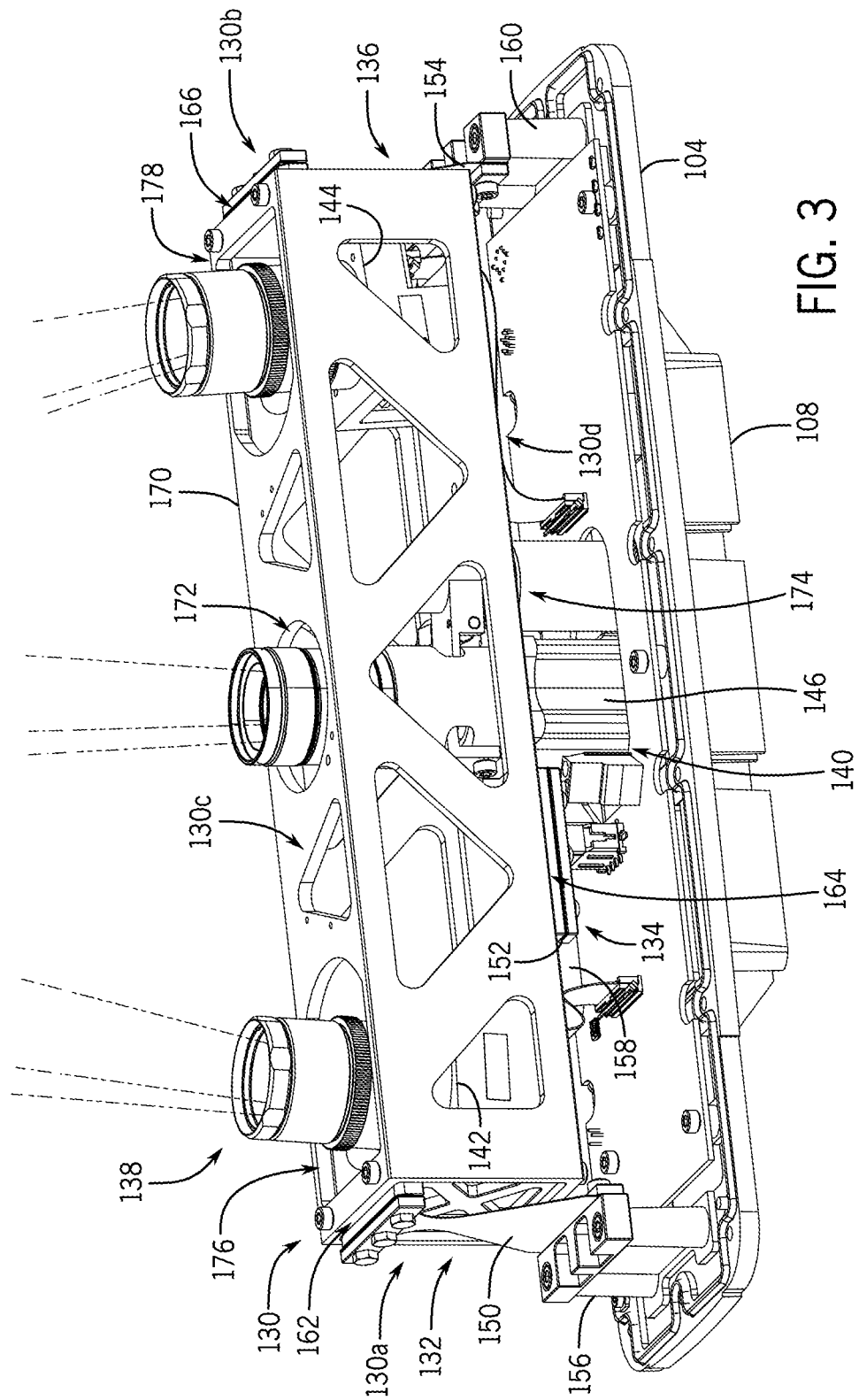
Figure 4:
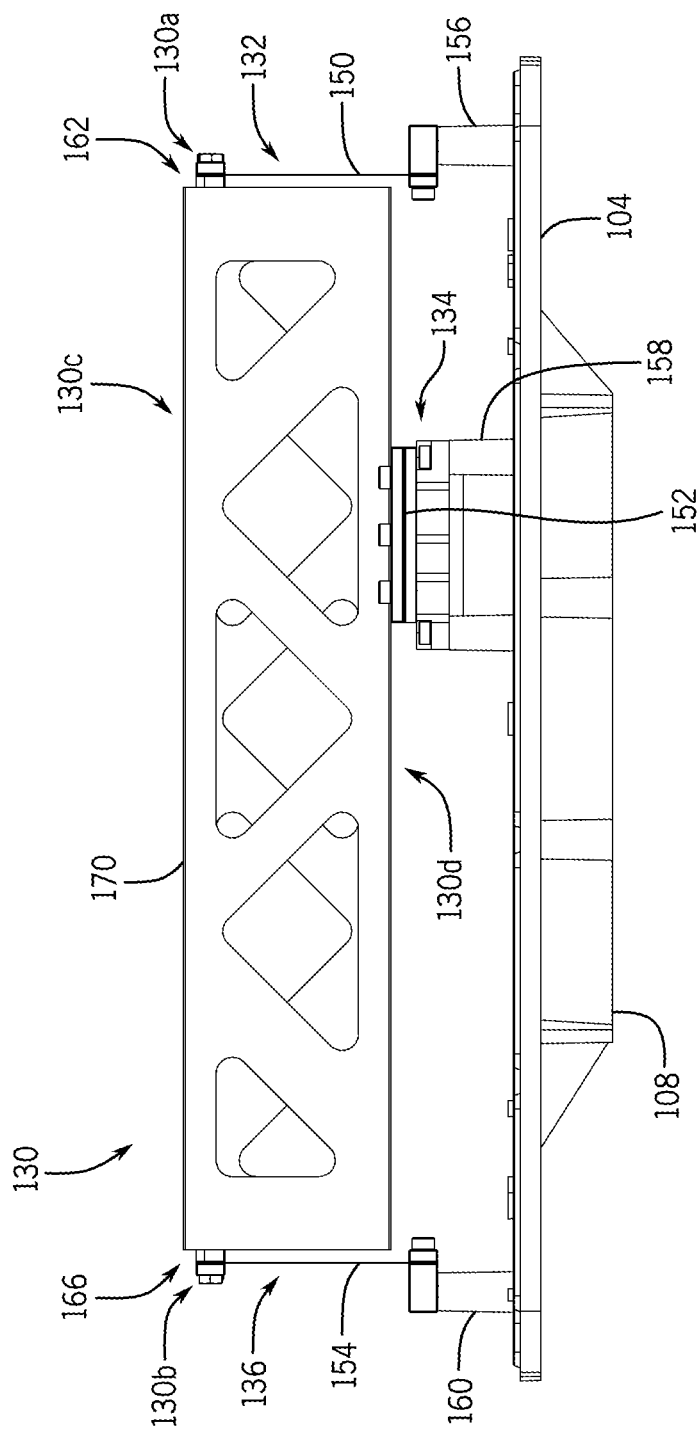
FIGS. 4 and 5 are front and rear elevation views of the base and the optical support system of FIGS. 2 and 3, including flexure mounts and an optical chassis of the optical support system.
Figure 5:
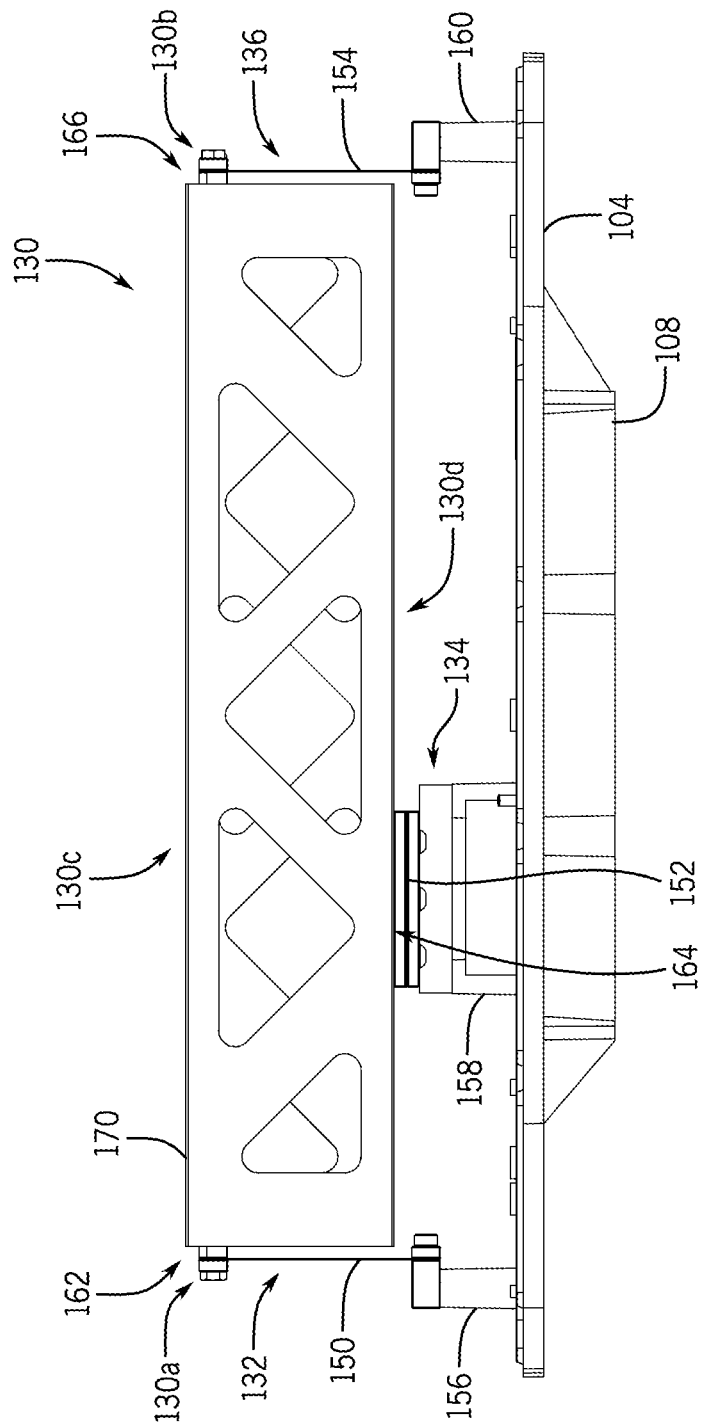

FIGS. 2 and 3 illustrate certain internal components of the optical system 100, as can be generally enclosed by the housing 102 and supported by the base support 104 thereof relative to an environmental structure (not shown). In other embodiments, other components can be used, as can other configurations of the components expressly illustrated in FIGS. 2 and 3 and discussed below. Further, in some installations, the optical system 100 can be supported by the base support 104 relative to an environmental structure via connection of the base support 104 to the shell 106, with the shell 106 secured to the environmental structure via the mounting plate 118 or another mounting feature.

In the illustrated embodiment, the optical system 100 includes an optical chassis 130 that is supported relative to the base support 104 by a flexure arrangement that includes a set of three flexures 132, 134, 136. The optical chassis 130 directly supports an example high-precision optical arrangement 138, which includes, in the embodiment illustrated, a set of two imaging devices 142, 144 that are mounted at respective opposite longitudinal ends 130a, 130b of the optical chassis 130.

In the illustrated embodiment, the optical arrangement 138 is configured as part of a structured-light 3-D scanner, with the imaging devices 142, 144 being precisely aligned relative to each other and the optical chassis 130, and being configured to interoperate with each other and with a lower-precision optical arrangement 140 that is mounted to the base support 104. In this regard, for example, the imaging devices 142, 144 may be configured to interoperate effectively based on the expectation that a calibrated distance 148 between the imaging devices 142, 144 (see FIG. 2) may be appropriately maintained.

Relatedly, it may be useful to mount components of the lower-precision optical arrangement 140, such as a projector 146, to the base support 104, while mounting the imaging devices 142, 144 to the optical chassis 130, as supported relative to the base support 104 by the flexures 132, 134, 136. For example, for some operations, relative alignment between the imaging devices 142, 144 (e.g., the calibrated distance 148) may need to be controlled to ensure an overlay error of at most a fraction of a projected pixel in the imaging field (not shown), whereas corresponding precision in alignment of the projector 146 may not be needed. Further, mounting the projector 146 to the base support 104, rather than to the optical chassis 130, can allow for more effective dispersion, through the heat sink 108, of heat generated by the projector 146, while also somewhat thermally isolating the optical chassis 130 from projector 146, as may help to reduce distortion of the optical chassis 130 due to thermal effects. In other embodiments, however, other configurations are possible. For example, it may be useful in some configurations to mount the projector 146 or another similar component to the optical chassis 130 rather than to the base support 104.

In different embodiments, different configurations of relevant optical arrangements) are possible. For example, any number or variety of optical components can be used, including imaging devices with complementary metal-oxide semiconductor ("CMOS"), charge coupled device ("CCD") or other sensors, projection devices that employ digital light processing ("DLP"), liquid crystal on silicon ("LCOS"), liquid crystal display ("LCD"), or printed mask technologies, and so on, or various non-imaging devices (e.g., projectors).

As noted above, a flexure arrangement according to the technology can generally help to provide a relatively rigid overall connection between an optical chassis and a support structure, while providing relatively unrestricted local movement relative to select degrees of freedom. In this way, for example, a flexure arrangement can securely support an optical chassis relative to housing or other support structure, while still allowing the optical chassis to move locally relative to the support structure. This may be useful, for example, in order to avoid distortion of the optical chassis, and the corresponding misalignment of supported optical components, due to local deformations or other movements of the support structure.

Depending on the particular needs of an installation, and the types of flexures employed, a flexure arrangement can be secured to an optical chassis and to a base support in many ways, including in many different orientations and by using many different numbers and configurations of mounting structures and attachment devices. Further, different types and arrangements (e.g., orientations or numbers) of flexures can be used in order to provide different, and appropriately balanced, local and comprehensive restrictions on movement relative to the six degrees of freedom that define a physical system.

As noted above, one example of a flexure arrangement, which uses the flexures 132, 134, 136, is illustrated in FIGS. 2-6. In the embodiment illustrated, the flexures 132, 134, 136 include substantially identical, substantially planar, flexible sheet-metal flexure elements 150, 152, 154. The flexure element 150, which is substantially similar to the flexure elements 152, 154 in the illustrated embodiment, is shown isolated in FIG. 7A. In the illustrated embodiment, the flexure element 150 has a mounting feature 196, shown here as a set of holes 196 at each of a first end 150*a* and a second end 150*b*, which defines a flexure length 198 of the flexure element 150.

Figure 6:
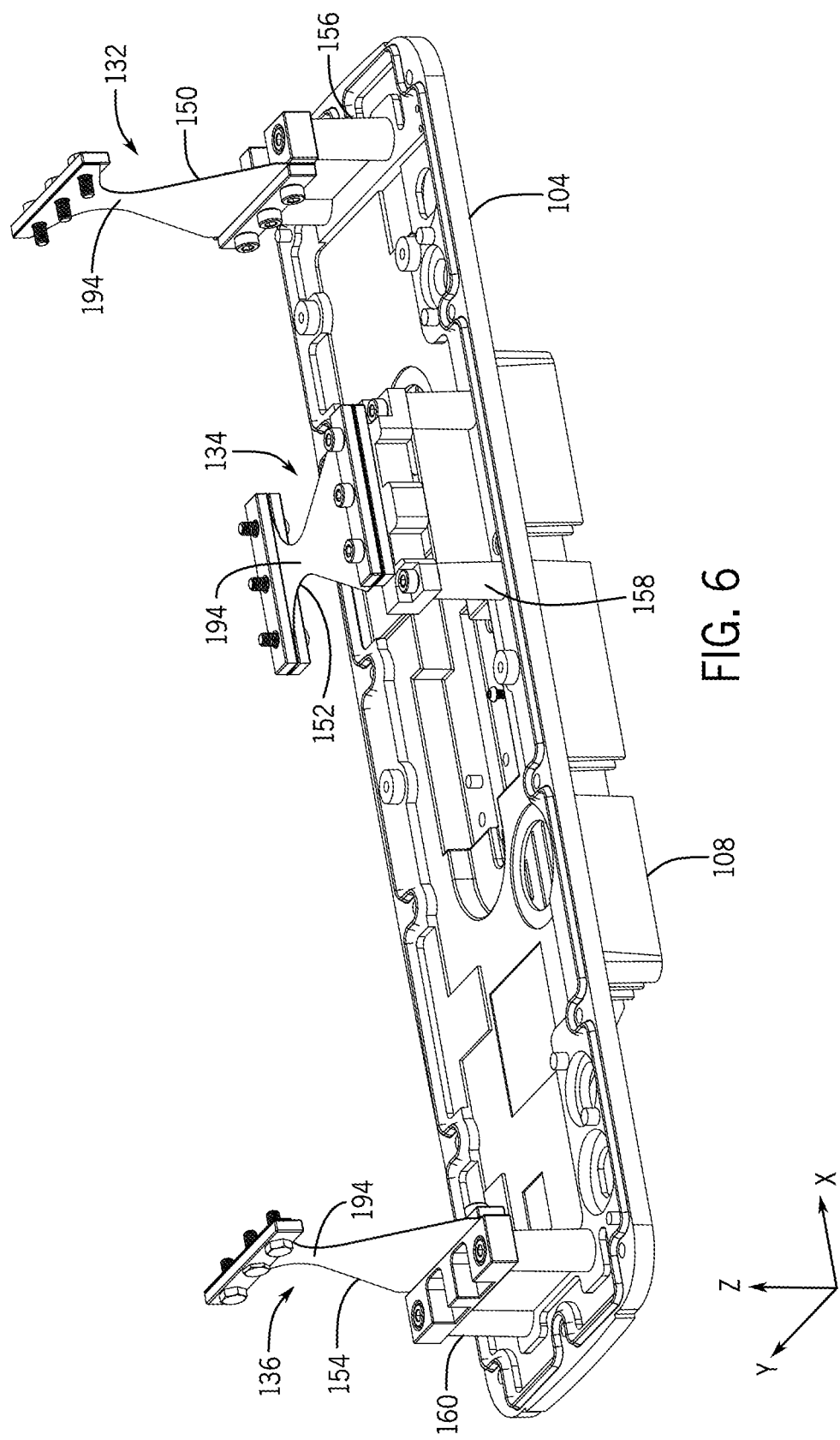
FIG. 6 is an isometric view of the base and the flexure mounts of FIGS. 4 and 5.

Generally, mounting features can be used to secure flexure elements in appropriate orientations relative to support structures and supported components. As shown in FIG. 6, for example, the first end 150*a* of the flexure elements 150 is secured at rigid mounting structure 156 on the base support 104. Similarly, the first ends of the other flexure elements 152, 154 are secured at respective rigid mounting structures 158, 160. Further, the second end 150*b* of the flexure element 150 is secured at mounting location 162 on the optical chassis 130. Similarly, the second ends of the other flexure elements 152, 154 are secured at respective mounting locations 164, 166 (see, e.g., FIG. 5 for the mounting location 164). In this way, for example, and as also discussed below, the flexures 132, 134, 136 can appropriately support the optical chassis 130.

Figure 7B:
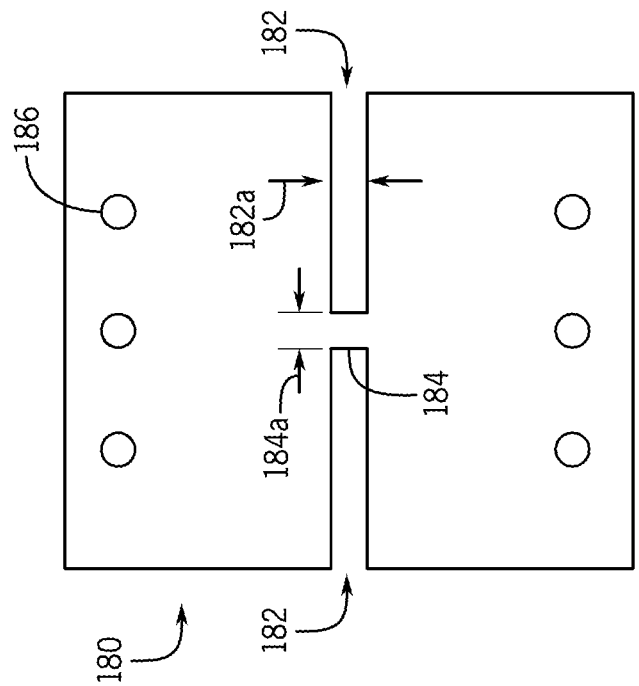
FIG. 7B is a front elevation view of a flexure mount according to an embodiment of the technology.
Figure 7A:
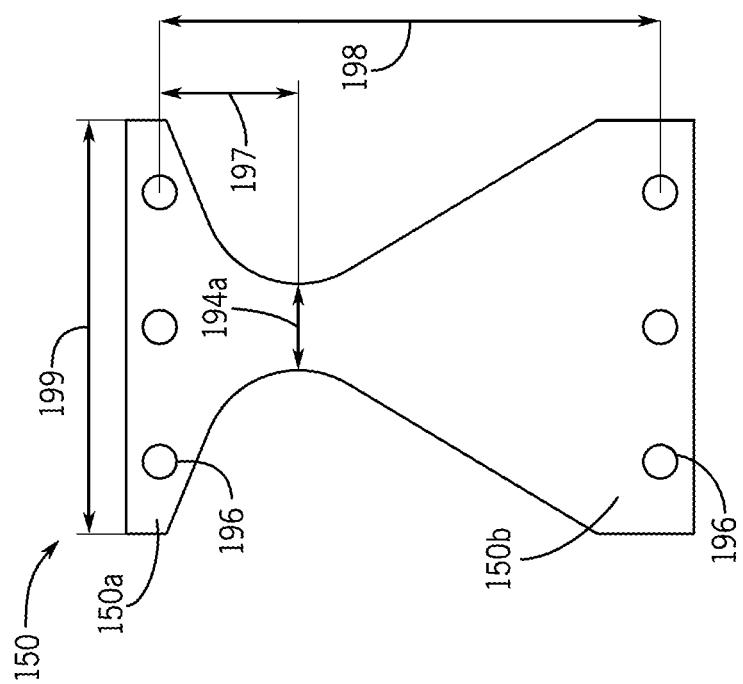
FIG. 7A is a front elevation view of a flexure mount of FIG. 6.

In some embodiments, it may be useful to configure a flexure element to exhibit varied structural strength at different locations along the flexure element. For example, as illustrated in FIG. 7A, the flexure element 150 has a neck 194 that defines a neck width 194*a* at the narrowest (laterally) portion of the flexure element 150. In the embodiment illustrated, the narrowest portion of the neck 194 is located closer to the first end 150*a* of the flexure element 150 than the second end 150*b*, at a distance 197 from the center of the mounting feature 196 at the first end 150*a*. Accordingly, the neck 194, with the flexure element 150 installed as shown in FIGS. 2 and 3, may be disposed closer to the mounting location 162 on the optical chassis 130 than to the mounting location 156 on the base support 104. Also in the illustrated embodiment, the neck 194 defines a cut-out curve that angles more sharply toward the narrowed width 194*a* near the first end 150*a* of the flexure element 150 than near the second end 150*b* of the flexure element 150. Accordingly, the neck 194, with the flexure element 150 installed as shown in FIGS. 2 and 3, may be disposed closer to the mounting location 162 on the optical chassis 130 than to the mounting location 156 on the base support 104.

In other embodiment, however, other configurations are possible. For example, the narrowest portion of the neck 194 could be closer to the second end 150*b*, halfway between the first and second ends 150*a*, 150*b*, or any position along the length 198 of the flexure element 150. In some embodiments, it may be particularly useful to dispose the narrowest portion of the neck 194 such that the distance 197 is from about 25% to about 75% of the length 198. In some embodiments, it may be particularly useful to configure a flexure element to be symmetrical, such as illustrated for the flexure element 150, which is shown to be symmetrical at a center line (not shown) running along the length 198.

Figure 9:
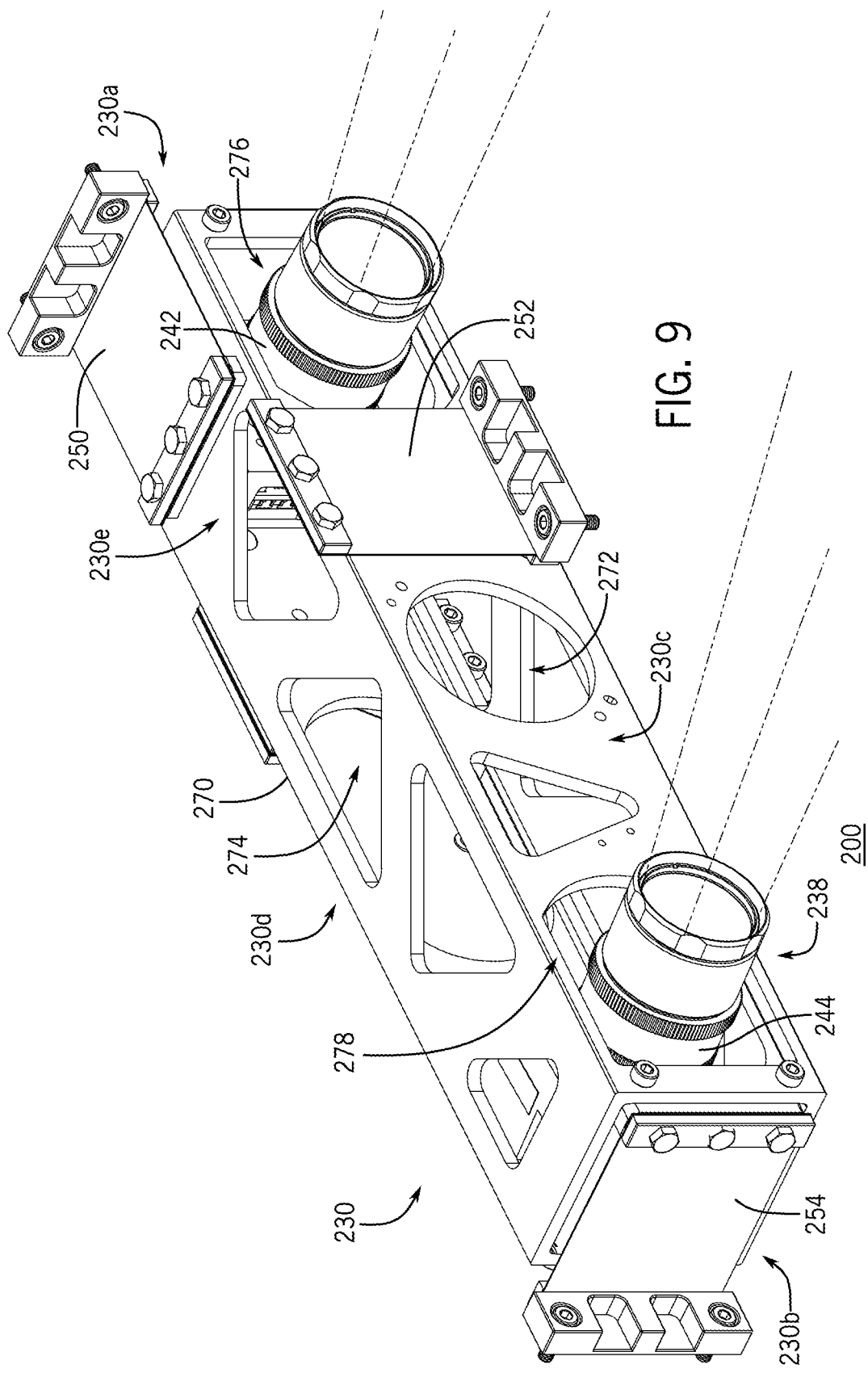
FIG. 9 is an isometric view of an optical support system and associated optical components, according to an embodiment of the technology.

As another example, in different embodiments, the neck width 194*a* of the neck 194 can be in the range of about 5% to about 95% of the width 199 of the flexure element 150 at one or both of the first and second ends 150*a*, 150*b*. In some embodiments, no reduced-width neck may be provided. For example, FIG. 9 illustrates an example flexure element 254 with a uniform width between the first and second ends.

In some embodiments, contours of a flexure that define a neck may be different than those shown in FIG. 7A. For example, FIG. 7B illustrates an example flexure element 180 in which a set of cut-outs 182, each with a cut-out width 182*a*, extend inwardly toward each other from opposing sides of the flexure element 180 to define a neck 184 with a neck width 184*a*. As stated previously with respect to the flexure element 150 shown in FIG. 7A, the position of the neck 184 can vary along the length and width of the flexure element 180, and the neck width 184*a* can vary in dimension as a ratio of the width of the flexure element 180 at the mounting feature.

In some embodiments, a flexure may exhibit a neck that is formed by reduced thickness (e.g., into the page in FIGS. 7A and 7B) of a flexure element. For example, to provide similar flexible response to forces as the flexures 150, 180, an alternative flexure element may exhibit a constant (or other) width, with narrowed material thickness over a neck of the flexure element.

Referring again to the example, optical system 100 as shown in FIGS. 2 through 5, the flexure elements 150, 152, 154 and associated mounting arrangement can provide a useful combination of secure structural support and isolation from stresses for the optical beam chassis 130 and the associated optical arrangement 138. For example, due to the flexure elements 150, 152, 154 as mounted, the optical chassis 130 is relatively free to translate, at each of the mounting locations 162, 164, 166, in a single direction perpendicular to the plane of the relevant flexure element 150, 152, 154, as well as to roll and twist about the axis that extends in parallel with the plane of the relevant flexure element 150, 152, 154 (and, in the illustrated example, with the linear array of the various illustrated fasteners at the respective mounting locations 162, 164, 166).

Figure 8A:
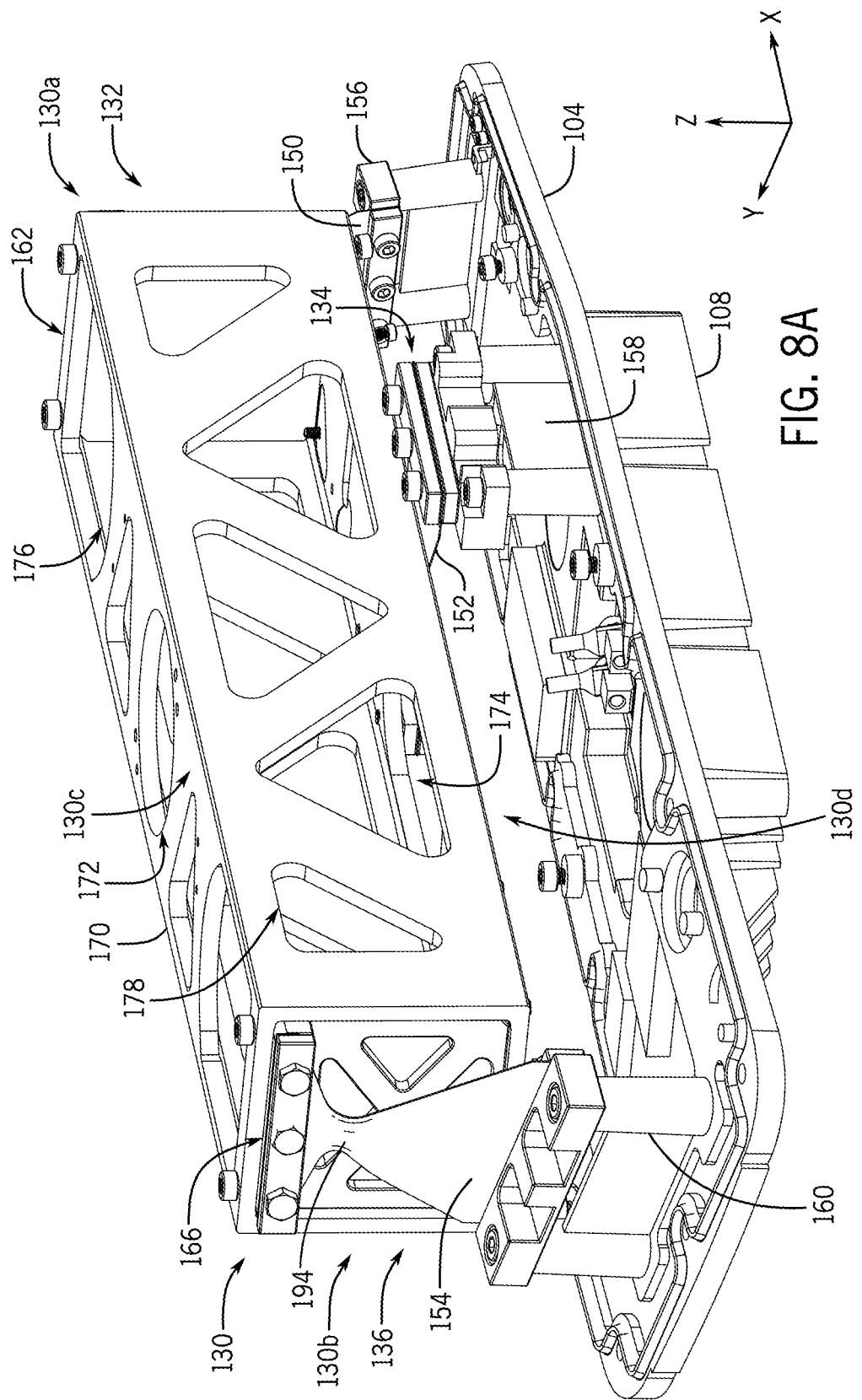
FIGS. 8A and 8B are isometric and isometric partial views of the base and optical support system of FIGS. 2 and 3 as subjected to example stresses.
Figure 8B:
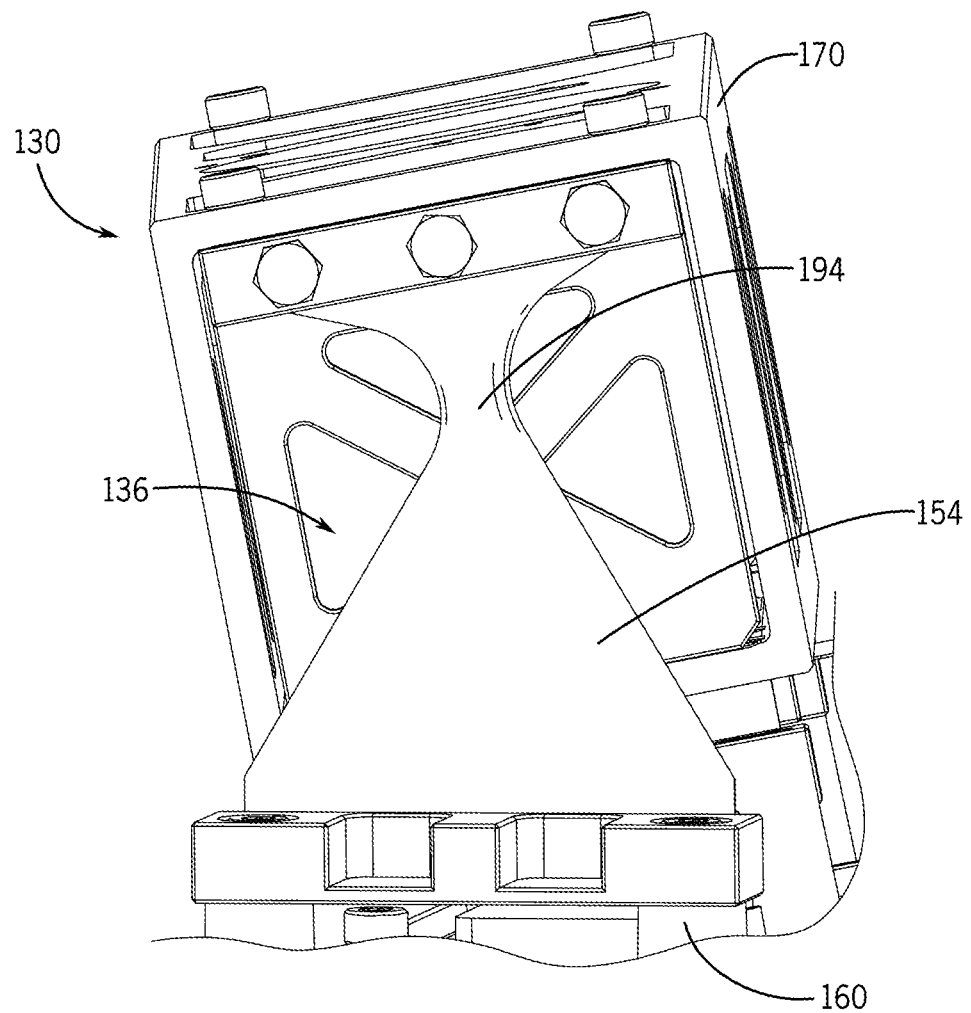

In some embodiments, a flexure element with a reduced-width neck, such as the planar flexure elements 150, 152, 154, can provide additional freedom of movement to appropriately absorb torsional (or other) deformation of the relevant support structure. As illustrated in FIGS. 8A and 8B, for example, and referring to the reference coordinate system shown in FIG. 8A, the planar configuration of the flexures 132, 136 locally allows the optical chassis 130 to translate along the X-axis and to roll about the Y-axis. Further, the reduced-width necks of the flexures 132 136 allow the optical chassis to twist somewhat about the X-axis and the Z-axis. Further, the flexures 132, 136 can locally substantially restrict translation and rotation in other directions. In contrast, the flexure 134 primarily locally allows the optical chassis 130 to translate along the Z-axis and the X-axis, and to roll about the X-axis, and to twist slightly about the Y-axis and the Z-axis, while locally substantially restricting translation and rotation in other directions. In this regard, for example, it should be noted translation along a particular axis (e.g., the Z-axis) is typically accompanied by a corresponding translation or rotation along or about at least one other axis (e.g., rotation about the X-axis or translation along the Y-axis).

With the illustrated arrangement or other arrangements according to the disclosed technology, the flexures 132, 134, 136 can collectively substantially rigidly support the optical chassis 130 relative to the housing 102 (see FIG. 1). Further, each of the flexures 132, 134, 136 can flex independently to individually absorb particular types of movements of the base support 104, such as deformations of the base support 104 due to environmental forces or thermal effects, and can thereby help to prevent corresponding deformation of the optical chassis 130 and the resulting detriments to alignment of the optical arrangement 138 (see FIG. 3).

For some implementations, aspects of the flexure arrangement illustrated in FIGS. 2-6 can be particularly useful. In some cases, for example, the parallel arrangement of the flexures 132, 136 on the opposite ends 130a, 130b of the optical chassis 130 can improve the ability of the optical system 100 as a whole to operate reliably in a variety of orientations. For example, due to the weight of the optical chassis 130 and the optical arrangement 138, the optical chassis 130 can be deformed differently by gravity and other forces, depending on the orientation of the optical system 100 relative to gravity. Further, the anti-distortion benefits discussed above may not necessarily fully apply to distortions due to gravity and the weight of components of the optical system 100 itself, because gravity-driven deformation does not necessarily result from forces transmitted through the flexure arrangement. However, due to the illustrated generally parallel orientation of the flexures 132, 136, and the generally symmetrical attachment thereof at the opposite longitudinal ends 130a, 130b of the optical chassis 130, the flexures 132, 136 provide generally symmetrical support for the optical chassis 130 (e.g., from a mirror-symmetry perspective, as shown). Accordingly, in a number of different orientations, the optical chassis 130, as supported by the flexures 132, 136, can be expected to exhibit relatively symmetric deformation due to gravity. In some implementations, corrections to optical calculations relating to this relatively symmetric deformation can be implemented relatively easily, including through algorithmic adjustments. In contrast, for example, algorithmic corrections for non-symmetric deformation, as may result from cantilevered or certain other non-symmetric support arrangements, may be harder to implement.

As another example, in some implementations it may be useful to secure one flexure to an optical chassis at a location that is removed from a plane defined by one or more attachment locations of one or more other flexures. As illustrated in FIGS. 2-6, for example, the mounting locations 162, 166 of the flexure elements 150, 154 are adjacent to a lateral side 130c of the optical chassis 130, and the mounting location 166 for the flexure element 152 (see, e.g., FIG. 5) is located on a lateral side 130d of the optical chassis 130 that is opposite the lateral side 130c. This can allow the flexure 134 to appropriately support the optical chassis 130, in combination with the flexures 132, 136, without over-constraining the optical chassis 130, as could result in excessive deformation of the optical chassis 130 during certain movements of the base support 104.

As still another example, a necked configuration, such as shown for the flexure elements 150, 152, 154, may be particularly helpful in addressing torsional deformation. As illustrated in FIGS. 8A and 8B, for example, even up significant torsional deformation of the base 104 can be absorbed via torsional deformation of the flexure elements 150, 152, 154 at the necks thereof (e.g., the neck 194). In contrast, for example, some constant-width flexures in otherwise similar configurations may transmit substantial torsional forces to the relevant optical chassis, with potentially detrimental effects on calibrated distances therein.

Another example flexure arrangement is shown in FIG. 9, with flexure elements 250, 252, 254 that support an optical chassis 230 for an optical system 200, according to another embodiment of the technology. In the illustrated embodiment, the flexure elements 250, 252, 254 are substantially planar and have a constant width from the first end to the second end, although necked flexure elements such as the flexure elements 150, 152, 154 can be similarly employed. (Likewise, constant-width flexure elements, such as the flexure elements 250, 252, 254, can be used in arrangements similar to those illustrated in the preceding FIGS.).

Similarly to the arrangement of FIGS. 2-6, the flexure elements 250, 252, 254 are secured at different locations on the optical chassis 230 in order to collectively provide a generally rigid support system for the optical chassis 230 via individually implemented, localized, partial constraints. In contrast to the arrangement of FIGS. 2-6, however, the flexure element 250 is secured to a mounting location on the lateral side 230c of the optical chassis 230, and the flexure element 252 is secured to a mounting location on a different lateral side 230e of the optical chassis 230 than either of the flexure elements 250, 254. In this regard, for example, each of the flexure elements 250, 252, 254 substantially restricts translational movement of the optical chassis 230 along a unique respective axis, and substantially restricts rotational movement of the optical chassis 230 about a unique respective axis. In other embodiments, other configurations are possible, including configurations with different numbers of flexure elements or flexure arrangements, different numbers of locations of mounting locations, and so on.

In different embodiments, flexure arrangements and flexure elements thereof can exhibit a variety of different forms. In the examples discussed above, for example, the flexure elements 150, 152, 154 and 250, 252, 254 are generally planar and can be readily formed from relatively inexpensive materials using relatively simple manufacturing processes. In other embodiments, flexure elements can be secured to an optical chassis or to a support base in a variety of ways and, in some embodiments, can be integrally formed with one or more components of an optical chassis or a support base. Similarly, other types of flexure elements can be used, including non-planar elements, planar or other elements with relatively complex external contours or cut-outs, controllable elements such as those formed from piezoelectric materials, relatively complex (e.g., actively controllable) multi-component systems, and so on.

Generally, it may be useful to configure a flexure arrangement so that appropriate rigidity is provided overall, without over-constraining an optical chassis. In some embodiments, however, some degree of over-constraint may be possible, without significant detriment to system performance. For example, in the arrangement illustrated in FIGS. 2-6, a relatively small set of specific types of movements of the base support 104 may result in some deformation of the optical chassis 130. However, due to the specific configuration of the flexures 132, 134, 136, the arrangement of the mounting locations 160, 162, 153, and other aspects of the illustrated arrangement, the types of movements of the base support 104 that may result in such deformation may be substantially unlikely to occur during normal operation and may therefore not of particular concern for most expected installations. Accordingly, the relatively low cost and easy-to-install configuration of the illustrated embodiments, although potentially mathematically imperfect, can be generally deployed without significant detriment to overall performance.

In some embodiments, other aspects of optical arrangements according to the technology can also be useful. In some embodiments, for example, aspects of an optical chassis can contribute to valuable aspects of system performance. For example, it may be useful to configure an optical chassis to exhibit relatively high stiffness relative to associated flexures, while also maintaining a relatively low overall weight and spatial profile and allowing for a variety of mounting configurations for associated optical arrangements. In this regard, an optical chassis can take a variety of forms.

Figure 10:
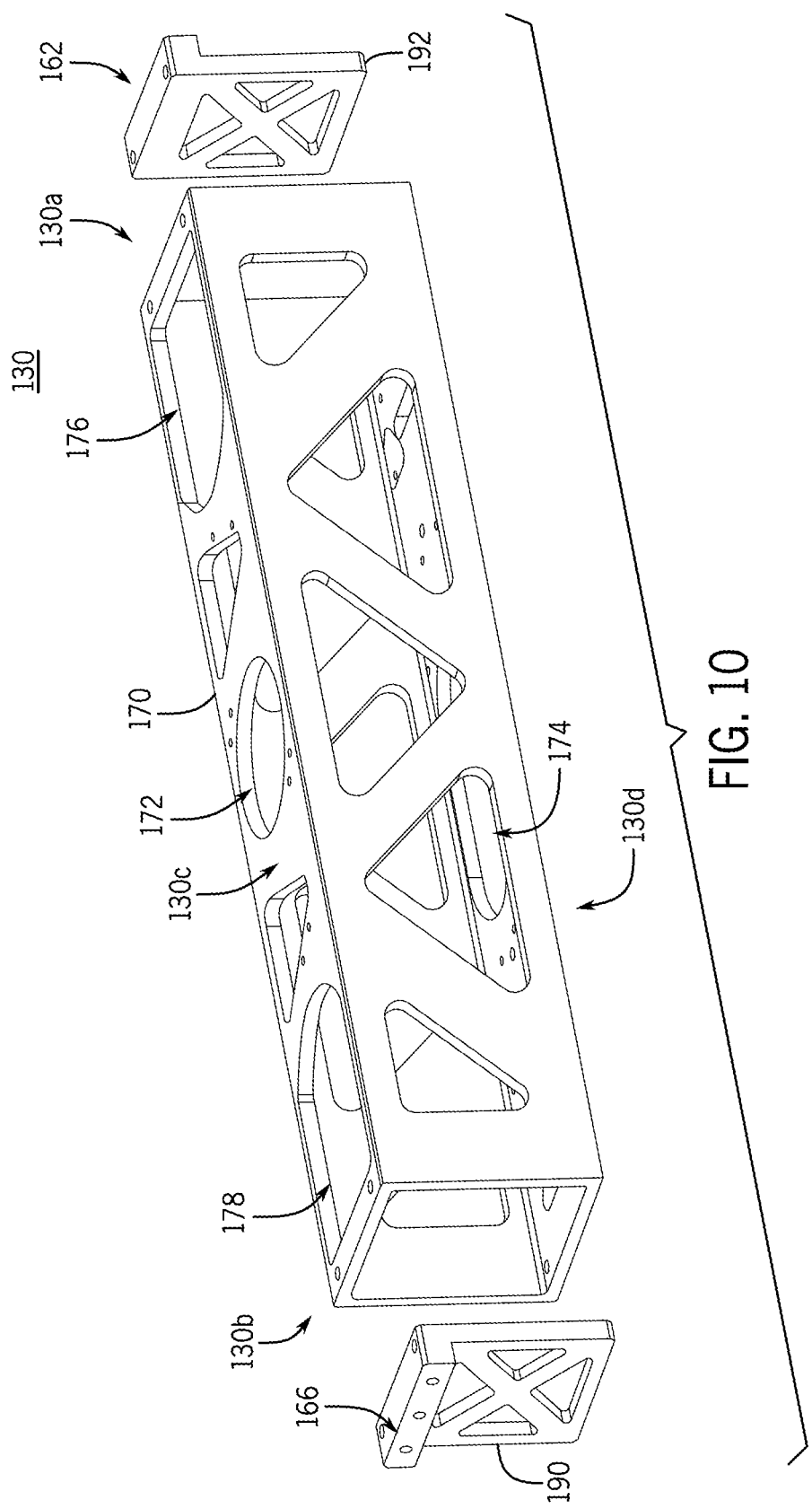
FIG. 10 is an exploded isometric view of an optical chassis according to an embodiment of the technology.

As one example, as illustrated in FIG. 10 in particular, the optical chassis 130 is configured as a multi-piece optical beam, including a single-piece, hollow central beam 170 with latticed lateral sides and open longitudinal ends. The latticed sides include a number of openings to reduce overall weight while retaining appropriate structural rigidity, as well as a number of relatively large optical openings 172, 174, 176, 178 that can allow for a variety of configurations of associated optical arrangements (and optical components). As illustrated in FIGS. 2 and 3, for example, the optical openings 176, 178 can allow the projector 146 and associated components to extend into and through the central beam 170 without contacting the central beam 170 or interfering with small-scale movement of the central beam 170 relative to the base support 104, including as the flexure arrangement absorbs deformations of the base support 104. Further, as illustrated in FIGS. 2 and 3 (see also FIG. 9), the optical openings 172, 174 can allow the imaging devices 142, 144 to be mounted to the central beam 170 in a number of orientations while still maintaining clear lines of sight between the imaging devices 142, 144 and relevant targets (e.g., via the optical openings 112, 116 illustrated in FIG. 1).

As also illustrated in FIG. 10, the optical chassis 130 further includes a set of end caps 190, 192 configured to be secured at opposite longitudinal ends of the central beam 170. In the embodiment illustrated, the end caps 190, 192 are latticed similarly to the central beam 170 and include a thickened upper portion at the mounting locations 162, 164. These thickened portions, for example, including when configured as squared flanges in the illustrated embodiment, can be configured to easily receive threaded fasteners to secure the flexure elements 150, 152 to the end caps 190, 192 (see also FIGS. 2 and 3), as well as fasteners (not shown in FIG. 10) to secure the end caps 190, 192 to the central beam 170.

Although the optical chassis 130 is generally discussed above as being employed as illustrated in FIGS. 2-6, other configurations are possible. For example, an optical chassis similar to the optical chassis 130 can be used in a variety of other arrangements. Similarly, an optical chassis that is differently configured than the optical chassis 130, such as may be useful to support other optical arrangements or be supported by other flexure arrangements, can be used in a variety of embodiments, including embodiments that are otherwise similar to those expressly illustrated in the FIGS.

Thus, embodiments of the technology can provide an improved mounting system for optical arrangements, as may be useful, for example, to protect calibrated alignment of precision optical components. In some embodiments, the disclosed arrangements can allow outer protective housings or other similar structures to be formed as relatively lightweight and inexpensive structures, which are able to locally distort due to environmental effects without transmitting substantially distorting loads to enclosed optical supports. In some embodiments, for example, flexure arrangements between optical chassis and associated support structures can result in relatively rigid overall support of associated optical arrangements, with locally permitted flexibility to avoid deformation of the optical chassis, as well as a relatively high natural frequency of the system overall, to prevent environmental vibrations from negatively affecting the optical arrangements. Further, because each flexure of a flexure arrangement can allow a specific number of degrees of freedom, flexure arrangements according to some embodiments of the technology can allow the position of an optical structure relative to an outer housing or other structural support to be relatively easily adjusted to an ideal configuration, before the flexures are secured and the system is installed for use. In this regard, for example, relevant systems can be fully and precisely assembled and calibrated at manufacturing location and then installed at operational location with high confidence in preservation of the calibrated arrangement.

While the technology has been described with reference to example embodiments, it will be understood by those skilled in the art that various changes may be made and equivalents may be substituted for elements thereof without departing from the scope of the technology. In addition, many modifications will be appreciated by those skilled in the art to adapt a particular instrument, situation or material to the teachings of the technology without departing from the essential scope thereof. Therefore, it is intended that the technology not be limited to the particular embodiments disclosed as the best modes contemplated for carrying out this technology, but that the technology will include all embodiments falling within the scope of the discussion above and the appended claims.

What is claimed is:

1. An optical system comprising:
  an optical arrangement that includes a first imaging device and a second imaging device;
  a housing including a base;
  an optical chassis including a support beam, the first and second imaging devices being mounted to the support beam to be spatially separated by a calibrated distance to operate cooperatively; and
  a flexure arrangement including a plurality of substantially planar flexures secured to the housing and to the optical chassis, to support the optical chassis relative to the base and to maintain the calibrated distance between the first and second imaging devices;
  the plurality of substantially planar flexures including a first flexure, a second flexure, and a third flexure;
  the first and second flexures extending substantially in parallel with each other, and the third flexure extending substantially perpendicularly to the first and second flexures; and
  the first flexure being secured at a first end of the support beam, the second flexure being secured at a second end of the support beam opposite the first end, and the third flexure being secured to the support beam between the first and second flexures.

2. The optical system of claim 1, wherein the third flexure is secured to the support beam along a first side of the support beam that faces the base; and
  wherein the first and second flexures are secured to the support beam adjacent a second side of the support beam that is opposite the first side.

3. The optical system of claim 2, wherein the support beam includes first and second removable longitudinal ends;
wherein the first flexure is secured to the support beam at the first removable longitudinal end; and
wherein the second flexure is secured to the support beam at the second removable longitudinal end.

4. An optical system configured to be mounted to a structure for operation, the optical system comprising:
a base configured to support the optical system relative to the structure;
an optical arrangement including optical components that are configured to interoperate and are spatially separated by a calibrated distance;
an optical chassis configured to support the optical arrangement relative to the base; and
a flexure arrangement, separate from the optical chassis, that connects the optical chassis to the base to maintain the calibrated distance of the optical components.

5. The optical system of claim 4, wherein the optical components of the optical arrangement include a first optical device mounted to the optical chassis at a first location and a second optical device mounted to the optical chassis at a second location, the first and second optical devices being spatially separated by the calibrated distance.

6. The optical system of claim 5, wherein the optical arrangement is a first optical arrangement, and wherein the optical system further includes a second optical arrangement that includes a third optical device mounted to the base.

7. The optical system of claim 6, wherein the first optical device is a first imaging device and the second optical device is a second imaging device; and
wherein the first and second imaging devices are disposed at respective opposite ends of the optical chassis and are configured to capture images of patterned light projected by the third optical device, as part of a structured-light 3-D scanner.

8. The optical system of claim 4, wherein the flexure arrangement includes a plurality of flexures, each configured as a substantially planar flexible sheet that is secured at a respective first sheet end to the base and at a respective second sheet end to the optical chassis.

9. The optical system of claim 8, wherein a first flexure and a second flexure of the plurality of flexures are secured at respective opposite longitudinal ends of the optical chassis; and
wherein a third flexure of the plurality of flexures is secured to the optical chassis on a first lateral side of the optical chassis.

10. The optical system of claim 9, wherein the first and second flexures are secured to the respective opposite longitudinal ends of the optical chassis adjacent to a second lateral side of the optical chassis.

11. The optical system of claim 10, wherein the first lateral side of the optical chassis is opposite the second lateral side of the optical chassis.

12. The optical system of claim 9, wherein the first and second flexures are disposed substantially in parallel with each other.

13. The optical system of claim 4, wherein one or more flexures of the flexure arrangement include a neck that defines a reduced width portion of the respective flexure.

14. The optical system of claim 4, wherein the optical chassis includes a multi-piece support beam, with removable longitudinal ends.

15. The optical system of claim 14, wherein a first flexure of the flexure arrangement is secured to the optical chassis at a first of the removable longitudinal ends; and
wherein a second flexure of the flexure arrangement is secured to the optical chassis at a second of the removable longitudinal ends.

16. An optical system for assembly in a first location and for installation in a second location different from the first location, the optical system comprising:
an optical arrangement configured to be mounted to an optical chassis, the optical arrangement including optical components fixedly mounted to the optical chassis a calibrated distance apart based on calibration performed in the first location;
a housing that surrounds the optical arrangement, to protect the optical arrangement when the housing is mounted in the second location; and
a flexure arrangement that connects the optical arrangement to the housing, to support the optical arrangement relative to the housing and maintain the calibrated distance between the interoperable optical components.

17. The optical system of claim 16, wherein the housing includes a cover and a base; and
wherein the flexure arrangement is secured to the base to support the optical arrangement relative to the base.

18. The optical system of claim 17, wherein the flexure arrangement includes a first flexure, a second flexure, and a third flexure, each configured as a substantially planar flexible sheet that is secured at a first end to the base and at a second end to the optical chassis;
wherein the first and second flexures are disposed substantially in parallel with each other, and are secured at respective opposite longitudinal ends of the optical chassis; and
wherein the third flexure is secured to the optical chassis on a first lateral side of the optical chassis.

19. The optical system of claim 18, wherein the first and second flexures are secured to the respective opposite longitudinal ends of the optical chassis adjacent to a second lateral side of the optical chassis; and
wherein the first lateral side of the optical chassis is opposite the second lateral side of the optical chassis.

20. The optical system of claim 19, wherein the optical arrangement includes a first optical device mounted to the optical chassis at a first of the respective opposite longitudinal ends and a second optical device mounted to the optical chassis at a second of the respective opposite longitudinal ends.

21. The optical system of claim 1, wherein the first and second imaging devices are fixedly mounted to the support beam and the calibrated distance is a preset calibration set during manufacture to allow the first and second imaging devices to operate cooperatively.

22. The optical system of claim 4, wherein the optical components are fixedly mounted to an optical chassis and are spatially separated thereon by the calibrated distance, which is determined and set during manufacture.

* * * * *

UNITED STATES PATENT AND TRADEMARK OFFICE
CERTIFICATE OF CORRECTION

| | |
|---|---|
| PATENT NO. | : 11,692,816 B2 |
| APPLICATION NO. | : 16/397769 |
| DATED | : July 4, 2023 |
| INVENTOR(S) | : Andrew Goodale et al. |

It is certified that error appears in the above-identified patent and that said Letters Patent is hereby corrected as shown below:

In the Specification

Column 6, Line 42, "arrangements)" should be --arrangement(s)--.

Signed and Sealed this
Nineteenth Day of September, 2023

Katherine Kelly Vidal
*Director of the United States Patent and Trademark Office*